(12) United States Patent
Vurgaftman et al.

(10) Patent No.: US 8,493,654 B2
(45) Date of Patent: *Jul. 23, 2013

(54) HIGH-TEMPERATURE INTERBAND CASCADE LASERS

(75) Inventors: Igor Vurgaftman, Odenton, MD (US); Jerry R. Meyer, Catonsville, MD (US); Chadwick Lawrence Canedy, Washington, DC (US); William W. Bewley, Falls Church, VA (US); James R. Lindle, Bowie, MD (US); Chul-soo Kim, Springfield, VA (US); Mijin Kim, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/353,770

(22) Filed: Jan. 19, 2012

(65) Prior Publication Data
US 2012/0127564 A1 May 24, 2012

Related U.S. Application Data

(63) Continuation of application No. 12/402,627, filed on Mar. 12, 2009, now Pat. No. 8,125,706.

(60) Provisional application No. 61/106,693, filed on Oct. 20, 2008.

(51) Int. Cl.
*H01S 5/30* (2006.01)
(52) U.S. Cl.
USPC ........................... 359/344; 372/43.01

(58) Field of Classification Search
USPC ........................ 359/344; 372/43.01
See application file for complete search history.

(56) References Cited

U.S. PATENT DOCUMENTS

| | | | |
|---|---|---|---|
| 5,588,015 A | 12/1996 | Yang | |
| 5,793,787 A | 8/1998 | Meyer et al. | |
| 5,799,026 A | 8/1998 | Meyer et al. | |
| 6,404,791 B1 | 6/2002 | Yang | |
| 7,282,777 B1 | 10/2007 | Yang | |
| 7,485,476 B2 | 2/2009 | Laikhtman et al. | |
| 8,125,706 B2 * | 2/2012 | Vurgaftman et al. | 359/344 |
| 2008/0304531 A1 | 12/2008 | Mansour et al. | |

OTHER PUBLICATIONS

K. Mansour et al., "Mid-infrared interband cascade lasers at thermo-electric cooler temperatures," Electronics Letters vol. 42 No. 18 (2006).

(Continued)

*Primary Examiner* — Mark Hellner
(74) *Attorney, Agent, or Firm* — Amy L. Ressing; Joslyn J. Barritt

(57) ABSTRACT

An interband cascade gain medium is provided. The gain medium can include at least one thick separate confinement layer comprising Ga(InAlAs)Sb between the active gain region and the cladding and can further include an electron injector region having a reduced thickness, a hole injector region comprising two hole quantum wells having a total thickness greater than about 100 Å, an active gain quantum well region separated from the adjacent hole injector region by an electron barrier having a thickness sufficient to lower a square of a wavefunction overlap between a zone-center active electron quantum well and injector hole states, and a thick AlSb barrier separating the electron and hole injectors of at least one stage of the active region.

8 Claims, 5 Drawing Sheets

OTHER PUBLICATIONS

L Shterengas et al., "Continuous wave operation of diode lasers at 3.36 μm at 12 ° C," Applied Physics Letters 93, 011103 (2008).

R. Yang et al., "High-power interband cascade lasers with quantum efficiency > 450%," Electronics Letters vol. 35, No. 15, pp. 1254-1255 (1999).

R. Yang et al., "Mid-Infrared Type-II Interband Cascade Lasers," IEEE Journal of Quantum Electronics, vol. 38, No. 6, pp. 559-568 (2002).

Search Report and Written Opinion of ISA in PCT Application No. PCT/US2009/059769.

* cited by examiner

HIGH-TEMPERATURE INTERBAND CASCADE LASERS

CROSS-REFERENCE

This application is a continuation of and claims the benefit of priority based on U.S. patent application Ser. No. 12/402,627 filed on Mar. 12, 2009, which in turn is a non-provisional of and claims the benefit of priority based on U.S. Provisional Patent Application No. 61/106,693 filed on Oct. 20, 2008, both of which are hereby incorporated by reference into the present application.

TECHNICAL FIELD

The present invention relates to an interband cascade gain medium and interband cascade lasers incorporating such a medium for improved laser or optical amplifier performance in the mid-infrared range at temperatures accessible with thermoelectric cooling or above.

BACKGROUND

There has been an increasing interest in the development of laser sources that emit in the mid-infrared ("mid-IR") spectral region, i.e., at wavelengths between about 2.5 and 8 µm. Such lasers have significant uses for both military and non-military applications. In the military realm, mid-IR lasers can be extremely useful as a countermeasure to jam heat-seeking missiles and prevent them from reaching their targets. In both the military and non-military realm, such mid-IR lasers have found use, for example, in chemical sensing, and so may be very useful in environmental, medical, and national security applications.

On the short-wavelength side of this spectral region, type-I quantum-well antimonide lasers are achieving excellent performance and greater maturity. See, e.g., L. Shterengas et al., "Continuous wave operation of diode lasers at 3.36 µm at 12° C.," *Appl. Phys. Lett.* 93, 011103 (2008). On the long-wavelength side of the mid-IR, intersubband quantum cascade lasers (QCLs) have become the dominant source of laser emissions. See, e.g., S. Slivken, et al., *Compound Semiconductors* (October 2008), at p. 21.

For the mid-infrared spectral region, the interband cascade laser (ICL) is being developed as a promising semiconductor coherent source.

The first ICLs were developed by Rui Yang in 1994. See U.S. Pat. No. 5,588,015 to Yang. The ICL may be viewed as a hybrid structure, which resembles a conventional diode laser in that photons are generated via the radiative recombination of an electron and a hole. However, it also resembles a quantum cascade laser in that multiple stages are stacked as a staircase, such that a single injected electron can produce an additional photon at each step of the staircase. See Slivken et al., supra; see also U.S. Pat. No. 5,457,709 to Capasso et al. This photon cascade is accomplished by applying a sufficient voltage to lower each successive stage of the cascade by at least one photon energy, and allowing the electron to flow via an injector region into the next stage after it emits a photon. An interband active transition requires that electrons occupying states in the valence band (following the photon emission) be reinjected into the conduction band at a boundary with semi-metallic or near-semi-metallic overlap between the conduction and valence bands. Outside of the active quantum well region and hole injector, transport in the ICL typically takes place entirely via the movement of electrons, although this is not required. Therefore, two optical cladding regions are generally used at the outsides of the gain medium to confine the lasing mode along the injection axis, and n-type contacts are provided outside the cladding regions to provide for electrical bias and current injection.

ICLs also employ interband active transitions just as conventional semiconductor lasers do. Although type-I ICLs are also possible (see U.S. Pat. No. 5,799,026 to Meyer et al., two inventors of which are the inventors of the present invention, and which is incorporated by reference into the present disclosure), most ICLs employ active transitions that are of type-II nature, i.e., the electron and hole wavefunctions peak in adjacent electron (typically InAs) and hole (typically Ga(In)Sb) quantum wells, respectively. In order to increase the wavefunction overlap, two InAs electron wells often are placed on both sides of the Ga(In)Sb hole well, and create a so-called "W" structure. In addition, barriers (typically Al(GaInAs)Sb) having large conduction- and valence-band offsets can surround the "W" structure in order to provide good confinement of both carrier types. See U.S. Pat. No. 5,793,787 to Meyer et al., which shares an inventor in common with the present invention and which is incorporated by reference herein. Further improvements to the basic ICL structure, such as including more than one hole well to form a hole injector, were subsequently made by the present NRL inventors and Dr. Yang. See U.S. Pat. No. 5,799,026 to Meyer et al., supra.

Despite these improvements, the performance of the first ICLs fell far short of the theoretical expectations. In particular, the threshold current densities at elevated temperatures were quite high (5-10 kA/cm$^2$ at room temperature in pulsed mode), which precluded continuous-wave (cw) operation of those devices at temperatures higher than ≈150 K. Later work by researchers at Army Research Laboratory, Maxion, and Jet Propulsion Laboratory further improved the operation of ICLs. See e.g., R. Q. Yang et al., "High-power interband cascade lasers with quantum efficiency>450%," *Electron. Lett.* 35, 1254 (1999); R. Q. Yang, et al., "Mid-Infrared Type-II Interband Cascade Lasers," *IEEE J. Quant. Electron.* 38, 559 (2002); and K. Mansour et al., "Mid-infrared interband cascade lasers at thermoelectric cooler temperatures," *Electron. Lett.* 42, 1034 (2006). However, performance in the mid-IR at room temperature still remained unsatisfactory.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention comprises an interband cascade gain medium and an interband cascade laser or amplifier having the same. An interband cascade gain medium in accordance with the present invention can include any one or more of the following features: (1) the active quantum well region includes a thick and In-rich GaInSb hole well; (2) the hole injector includes two or more Ga(InAlAs)Sb hole wells having thicknesses in a specified range; (3) the electron and hole injectors are separated by a thick Al(GaInAs)Sb barrier to suppress interband absorption; (4) the thickness of the first electron barrier of the hole injector region separating the hole injector region from an adjacent active quantum well region is sufficient to lower a square of a wavefunction overlap between a zone-center active electron quantum well and injector hole states to not more than 5%; (5) the thickness of the first InAs electron well in the electron injector, as well as the total thickness of the electron injector, is reduced; (6) the number of cascaded stages is reduced from 10 or more to the range between 2 and 7; (7) transition regions are inserted at the interfaces between the various regions of the gain medium so as to smooth out abrupt shifts of the conduction-band minimum; (8) thick separate confinement layers comprising Ga(AlInAs)Sb are disposed between the active gain region and the cladding to confine the optical mode and increase its overlap with the active stages; and (9) the doping profile of the superlattice (SL) cladding layers is optimized to minimize the overlap of the optical mode with the most heavily-doped portions of the cladding layers.

In accordance with the present invention, an interband cascade gain medium can employ one or more of the described features, and a laser incorporating such a gain medium can emit in the mid-IR range from about 2.5 to 8 μm at high temperatures with improved continuous wave performance and greater efficiencies.

DETAILED DESCRIPTION

Figure 1:
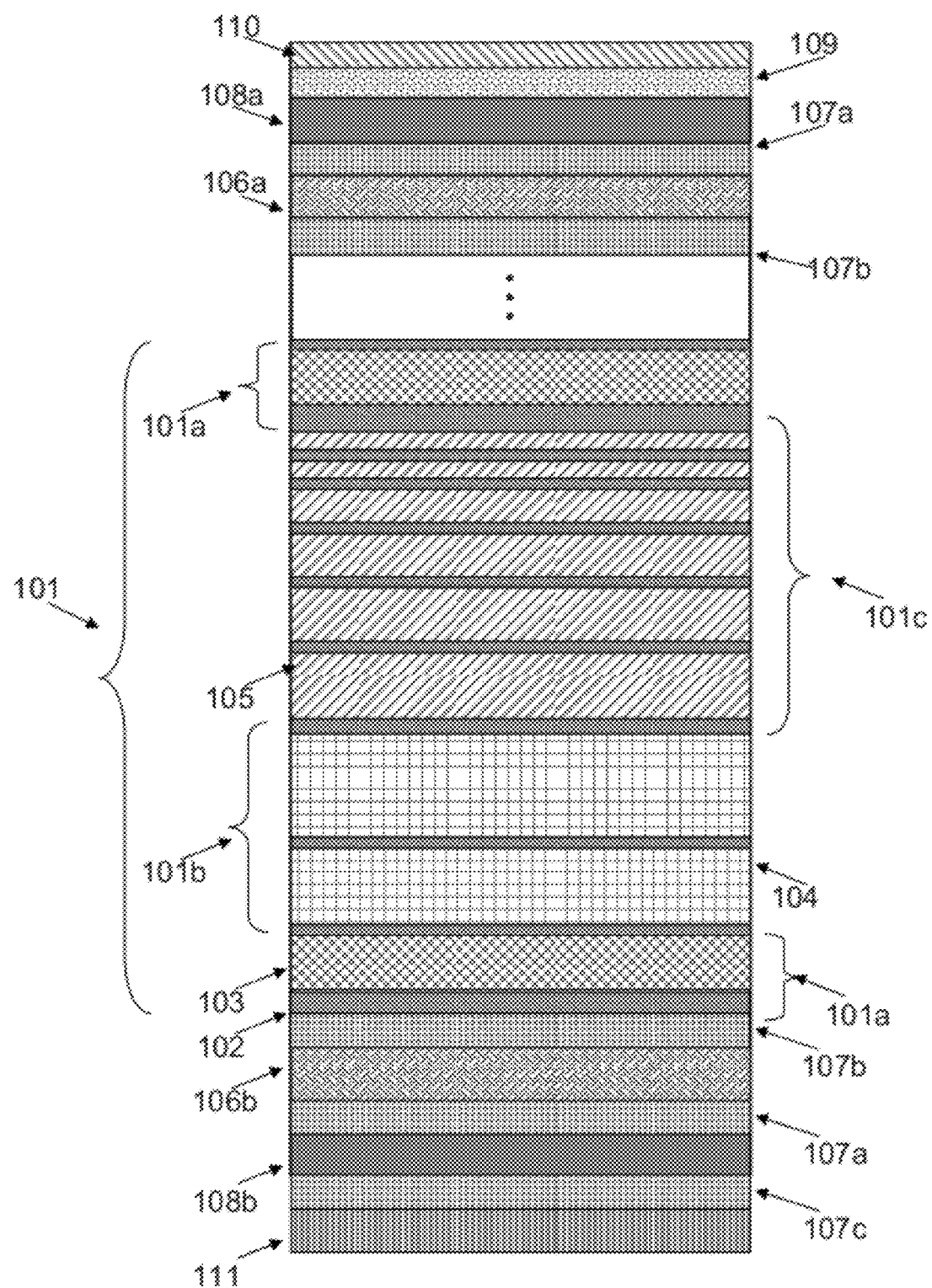
FIG. 1 is a block diagram depicting a layer structure of an exemplary interband cascade gain medium in accordance with the present invention.

The invention summarized above can be embodied in various forms. The following description shows, by way of illustration, combinations and configurations in which the aspects can be practiced. It is understood that the described aspects and/or embodiments of the invention are merely examples. It is also understood that one skilled in the art may utilize other aspects and/or embodiments or make structural and functional modifications without departing from the scope of the present disclosure.

For example, although the gain medium is described herein as comprising semiconductor layers of specified thicknesses arranged in a specified configuration, one skilled in the art would appreciate that other layer thicknesses and configurations may also be used. In addition, although the gain medium according to the present invention is described herein as comprising InAs, GaInSb, GaSb, and AlSb semiconductor materials, one skilled in the art will appreciate that other semiconductor materials may be substituted. In some embodiments, a small amount of In can be introduced into some of the AlSb layers for strain compensation, and such a case is denoted as having the structure "Al(In)Sb." For a lower barrier one may also introduce Ga to form Al(Ga)Sb. A small amount of As may also be added, to form Al(GaAs)Sb, in order to adjust the lattice constant for lattice matching or strain compensation. A more general alloy with barrier properties playing a similar role to AlSb is Al(GaInAs)Sb. Similarly, a small amount of Al and/or As can be introduced into the Ga(In)Sb; such cases are denoted as having the structure "Ga(Al)Sb," "Ga(As)Sb," and "Ga(AlAs)Sb," respectively. A more general alloy that can serve as a hole quantum well is Ga(AlInAs)Sb. Whenever an alloy composition is specified, such as $Ga_{1-x}In_xSb$, it is understood that the composition x may be zero (making the material GaSb in this example).

The present invention comprises an interband cascade gain medium and an interband cascade laser or amplifier using the same which can emit in the mid-IR range from about 2.5 to about 8 μm at high temperatures with improved continuous wave performance and greater efficiencies. Since many of the previous semiconductor lasers operating in this wavelength region have required cryogenic cooling, which is impractical for most applications, in the following description, the term "high temperature" will refer to temperatures of about 250 K and above, which can be accessed with a practical thermoelectric cooler or without any active cooling.

In accordance with the present invention, an interband cascade gain medium comprises a series of cascaded stages, each stage including an active gain region having an active quantum well region, a hole injector, and an electron injector comprising an InAs/Al(In)Sb SL. At each stage the active gain region can include at least one of the following features, which are described in more detail below: (1) the active quantum well region includes a thick and In-rich GaInSb hole well; (2) the hole injector includes two or more Ga(InAlAs) Sb hole wells having thicknesses in a specified range; (3) the electron and hole injectors are separated by a thick Al(GaInAs)Sb barrier to suppress interband absorption; (4) the thickness of the first electron barrier of the hole injector region separating the hole injector region from an adjacent active quantum well region is sufficient to lower a square of a wavefunction overlap between a zone-center active electron quantum well and injector hole states to not more than 5%; (5) the thickness of the first InAs electron well in the electron injector, as well as the total thickness of the electron injector, is reduced; and (6) the number of cascaded stages is reduced from 10 or more to the range between 2 and 7; (7) transition regions are inserted at the interfaces between the various regions of the gain medium so as to smooth out abrupt shifts of the conduction-band minimum; (8) a thick separate confinement layer comprising Ga(AlInAs)Sb is disposed at each end of the active gain region between the active gain region and an outer cladding layer to confine the optical mode and increase its overlap with the active stages; and (9) the doping profile of the cladding layers is optimized to minimize the overlap of the optical mode with the most heavily-doped portions of the cladding layers.

As described herein, an interband cascade gain medium in accordance with the present invention can have any one or more of features (1)-(9), either alone or in combination with any other of features (1)-(9). In accordance with the invention, each stage of the gain medium can have the same or different features or the same or different combination of features, and all such configurations are within the scope of the present disclosure.

The present invention also can include an interband cascade laser and an external cavity laser employing a gain medium having one or more of the features described above. See K. Mansour et al., supra; R. Maulini et al., "Widely tunable high-power external cavity quantum cascade laser operating in continuous-wave at room temperature *Electronics Letters* 45, 107 (2009)]. In accordance with the present invention, such an interband cascade or external cavity laser can emit in the mid-IR range from about 2.5 to 8 μm at temperatures at or above those accessible with thermoelectric cooling, with improved continuous wave performance and greater efficiency. In addition, the present invention also can include an interband cascade amplifier employing a gain medium having one or more of the features described above, and in accordance with the present invention, such an amplifier can amplify light in the mid-IR range from about 2.5 to 8 μm at temperatures at or above those accessible with thermoelectric cooling, with improved continuous wave performance and greater efficiency. See M. J. Connelly, *Semiconductor Optical Amplifiers* (Boston, Springer-Verlag, 2002).

A block diagram of an exemplary configuration of an interband cascade gain medium in accordance with the present invention is depicted in FIG. 1, where like-patterned areas are used to denote like or very similar materials.

As shown in FIG. 1 and as described herein, an interband cascade gain medium in accordance with the present invention can comprise a series of stacked layers of semiconductor material which can form a series of quantum barriers and wells that control the movement of electrons and holes in the medium. As shown in FIG. 1, an interband cascade gain medium in accordance with the present invention can include an active gain region comprising a series of cascaded stages, each stage 101 comprising an active quantum well (QW) region 101a, a hole injector 101b, and an electron injector 101c. The components of the active gain region act in combination to produce electron and hole energy levels and wavefunctions which, when combined under appropriate bias and electrical injection, cause the emission of light from the medium. The individual stages 101 of the active gain region are repeated a number of times to comprise the gain medium. As noted above, each iteration of the individual stages 101 can include one or more of the features described herein, with each individual stage including the same or different features as the other stages in the gain medium.

The gain medium further can include separate confinement layers (SCLs) 106a and 106b which can be located at each end of the active gain region, cladding layers 108a and 108b, and a substrate 111, with a first transition region 107a disposed between SCL 106a and cladding 108a, a second transition region 107b between SCL 106b and cladding 108b, a third transition region 107c between cladding layer 108b and substrate 111, a fourth transition region 107d between active gain region 101 and SCL 106a, and a fifth transition region 107e between active region 101 and SCL 106b, to smooth out the abrupt voltage shift in the conduction band profiles of the two adjoining regions. In some embodiments (not shown), an additional contact layer can be also disposed between substrate 111 and cladding layer 108b. In addition, an n$^+$-InAs or other suitable top contact layer 110 can be disposed at the top of the epitaxial structure, with a second transition region 109 disposed between the top contact layer 110 and the top cladding layer 108 to again smooth out the otherwise-abrupt shift of the conduction band profile.

In accordance with aspects of operation of semiconductor interband lasers known in the art, the structure of a gain medium in accordance with the present invention produces conduction and valence band energies and corresponding electron wavefunctions that govern the movement and recombination of electrons and holes in the semiconductor materials and so govern the creation and emission of photons by the laser.

Figure 2A:
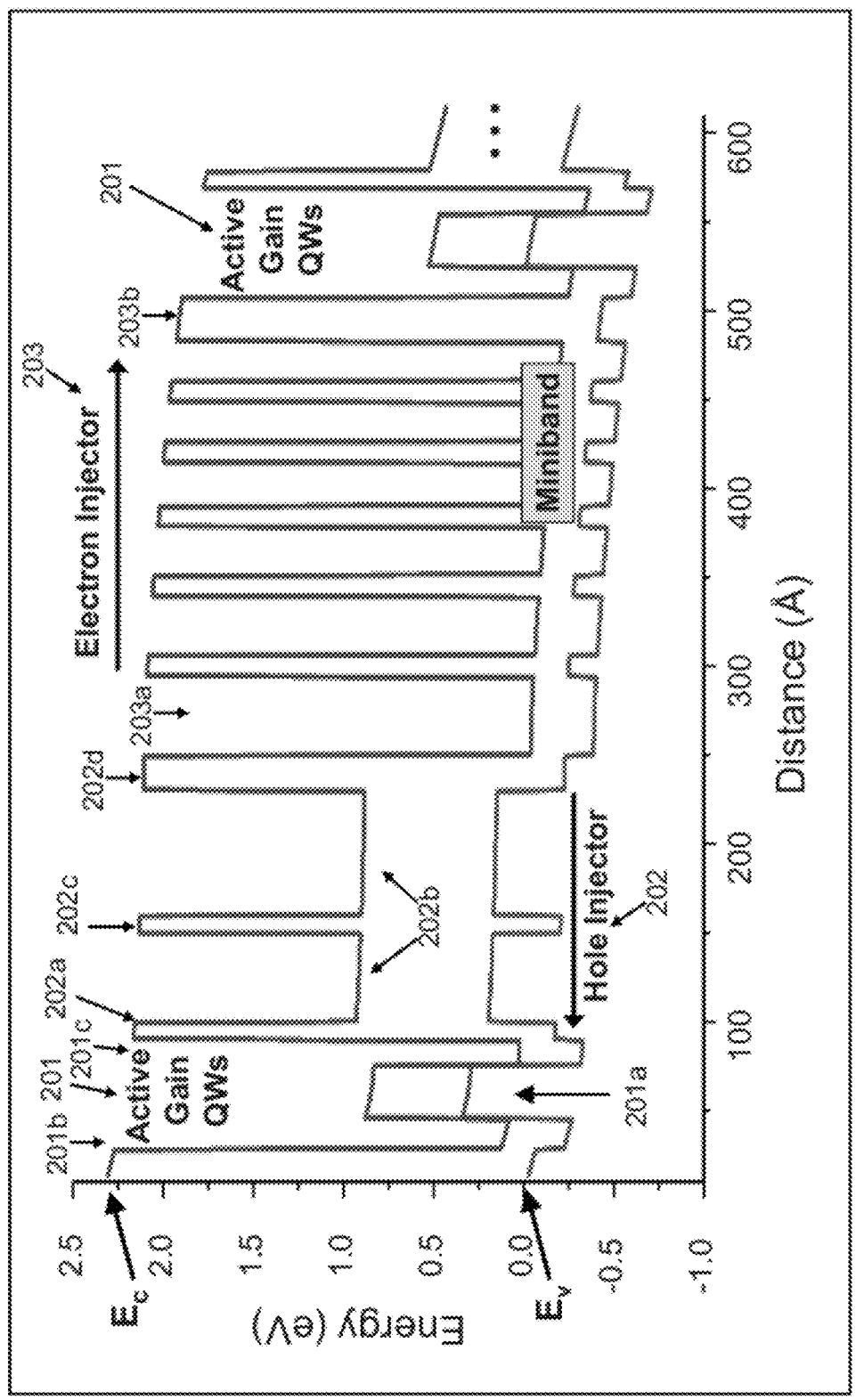
FIG. 2A depicts the conduction and valence band profiles of an exemplary active gain region of an interband cascade gain medium in accordance with the present invention.
Figure 2B:
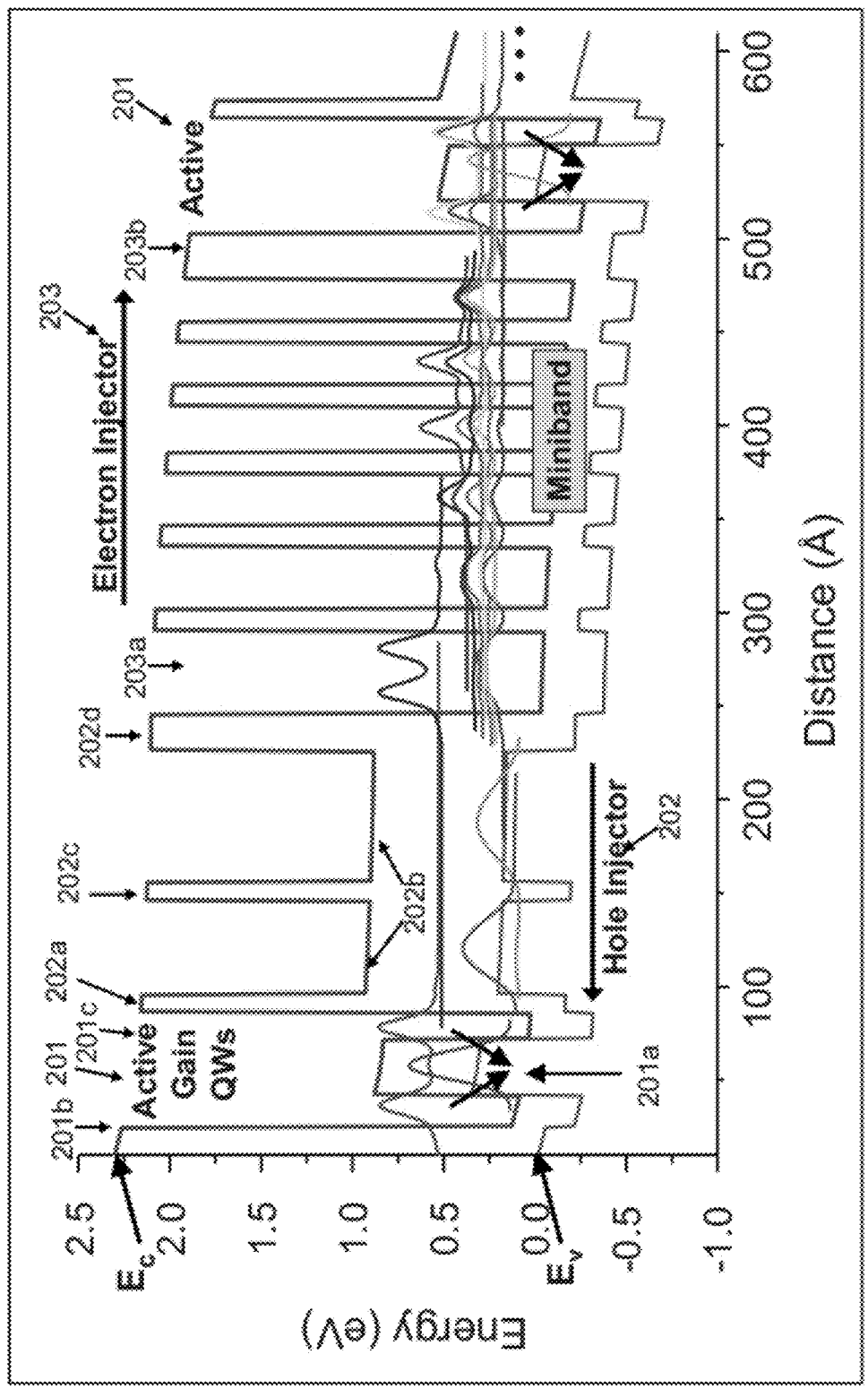
FIG. 2B depicts selected electron and hole energy levels and wavefunctions corresponding to the conduction and valence band profiles shown in FIG. 2A.

FIGS. 2A and 2B are block diagrams showing plots of the conduction band profiles ($E_c$) and valence band profiles ($E_v$) in an exemplary stage of the active gain region, along with the beginning of the next stage, of a gain medium incorporating one or more of the features described below in accordance with the present invention.

As seen in FIGS. 2A and 2B, each stage of the active gain region consists of the electron and hole active QWs 201, a hole injector 202, and an electron injector 203, with a new stage, again beginning with electron and hole active QWs 201, cascading from electron injector 203.

In accordance with principles of semiconductor interband cascade lasers known in the art, electrons injected from an electron pump source populate conduction states in the active QWs 201. In the configuration shown in FIGS. 2A and 2B, the electrons are injected from left to right, although of course other directionalities of the electron source are possible. Photons are emitted via interband optical transitions from the conduction states to the valence states in the active QWs. Once in the active QW valence band, electrons tunnel to the first (and then the second, if it is present) Ga(InAlAs)Sb QW(s) 202b of the hole injector 202. Because of the type-II energy overlap between InAs and Ga(InAlAs)Sb, the key feature that allows cascading, electrons in the Ga(InAlAs)Sb valence band elastically scatter or tunnel to conduction-band states in the relatively-thick first InAs QW 203a of the electron injector 203. Once back in the conduction band, the electrons propagate through the InAs/Al(In)Sb SL having progressively-decreasing QW thickness that comprises the electron injector 203 to regain energy before tunneling through a final Al(In)Sb barrier 203b into the next active QWs 201 for recycling and the emission of additional photons. The cascading of multiple stages provides multiple photons (more power) out for every electron in at the expense of a higher bias voltage required to charge all of the active gain regions simultaneously. This trade is generally advantageous, since lower current for a given output power means that parasitic ohmic and non-ohmic voltage drops become relatively less important.

In accordance with the present invention, the operation of these aspects of an interband cascade gain medium can be improved by the incorporation of one or more of Features (1)-(9) described below.

Feature (1)—$Ga_{1-x}In_xSb$ Active Hole Quantum Well

As noted above, electrons and holes recombine in the active QWs 201 to produce photons. However, as is known in the art, in some cases the energy from the electron-hole pair does not produce a photon, but instead is transferred to another electron or hole, a process known as Auger recombination. Thus, one goal in laser design is to reduce the Auger recombination in order to reduce the non-radiative decay and thereby reduce the lasing threshold.

Some theories have predicted that the performance of type-II antimonide lasers such as those having the "W" or ICL configuration should depend strongly on the exact layering details, due to the potential for resonances between the energy gap and valence intersubband transitions. Such resonant processes could potentially degrade the laser performance due to increased free carrier absorption and Auger recombination. However, NRL investigations have not revealed any clear evidence for resonant processes, since the experiments show no obvious correlation between ICL performance and the details of the layering sequence in the active QW region. Nevertheless, the data show a general non-resonant trend towards lower ICL current-density thresholds and higher photon-production efficiencies as the In composition and thickness of the active hole QW 201a are increased.

Thus, in accordance with feature (1) of the present invention, active QWs 201 can include a $Ga_{1-x}In_xSb$ hole quantum well 201a surrounded by InAs electron quantum wells 201b and 201c. In accordance with the present invention, the $Ga_{1-x}In_xSb$ hole QW 201a has a composition x that is as large as possible while maintaining high growth quality (e.g., as characterized by morphology and x-ray linewidths) and can have a thickness of about 25 Å to about 50 Å. In an exemplary embodiment, active QWs 201 employ a $Ga_{1-x}In_xSb$ hole QW of composition x=0.35 and thickness 30 Å. In addition, the thicknesses of the two adjacent InAs electron QWs 201b and 201c can be adjusted so as to produce the desired emission wavelength.

Analysis of the ICL threshold data has shown that a gain medium having active QWs 201 with this feature in accordance with the present invention have a smaller Auger coefficient and exhibit lower ICL current-density thresholds at higher temperatures near ambient.

Feature (2)—Hole Injector Having Two Ga(InAlAs)Sb Hole Quantum Wells

As noted above, each active gain stage 101 of an interband cascade gain medium can include a hole injector 202 to prevent the tunneling of electrons in the active electron QWs 201b and 201c directly into the electron injector 203. As shown in FIGS. 2A and 2B, hole injector 202 can comprise a series of alternating hole QWs 202b and barriers 202a, 202c, and 202d, where each barrier 202a, 202c, and 202d can be either AlSb or AlGaInAsSb and each hole QW 202b can be either GaSb or Ga(InAlAs)Sb. In accordance with feature (2) of the present invention, hole injector 202 can comprise two Ga(InAlAs)Sb hole QWs 202b as shown in FIGS. 2A and 2B, each of which has a thickness greater than that used in prior structures, with a total thickness for both hole QWs exceeding about 100 Å. Thus, in an exemplary embodiment, hole injector 202 can comprise AlSb/GaSb/AlSb/GaSb/AlSb layers having the conduction and valence band energy levels and corresponding wavefunctions shown in FIGS. 2A and 2B. One may also reach the total thickness of 100 Å by employing more than two hole QWs.

In accordance with the present invention, this feature inhibits electron tunneling (either coherent or incoherent) between the active electron QWs 201b and 201c and the electron injector 203. If this parasitic tunneling is negligible, almost all electrons are transported via the valence-band states in the hole injector 202, ideally after making a radiative transition. The wavefunction overlap between electron states in the active electron QWs 201b and 201c seen in FIG. 2B, and the electron states in the initial portion of the electron injector 203a under these conditions is negligible, and the barrier is also thick enough to effectively eliminate trap-assisted tunneling.

An exemplary structure of a hole injector 202 having two Ga(InAlAs)Sb hole QWs 202b in accordance with the present invention comprises 10 Å AlSb/50 Å GaSb/10 Å AlSb/70 Å GaSb/20 Å AlSb. The first AlSb barrier 202a shown in FIGS. 2A and 2B separates the InAs/GaInSb/InAs "W" active QWs 201 from hole injector 202. In accordance with the present invention, barrier 202a should be thick enough to lower the square of the wavefunction overlap between the zone-center active electron and injector hole states to <5%, so as to reduce the rate of any interband transitions not involving the active QW region.

Feature (3)—AlSb Barrier Between Hole Injector and Electron Injector

The last AlSb barrier in the structure of hole injector 202 described above is barrier 202d shown in FIGS. 2A and 2B and is between hole injector 202 and InAs/AlSb electron injector 203. This is the point at which electrons in the valence band (following the photon emission) make their transition back to the conduction band. While it had been thought that this barrier should be no thicker than ≈15 Å to allow an adequate interband scattering rate, in accordance with feature (3) of the present invention, the thickness of AlSb barrier 202d can be increased to 20-25 Å. Recent NRL data confirm that this reduces the interband absorption, which was found to be a larger effect than previously believed, while still allowing adequate transport from the valence band to the conduction band.

To be optimal, this barrier thickness should lead to an interband optical matrix element no greater than 0.2 eV Å at the zone center, while retaining a wavefunction overlap of at least 0.3% to maintain adequate interband scattering.

Feature (4)—Thickness of Electron Barrier Lowering of Wavefunction Overlap

As described above with respect to FIG. 1 and as seen in FIGS. 2A and 2B, the active gain region comprises a series of alternating barriers and quantum wells. As seen in FIGS. 2A and 2B, hole injector 202 is separated from an adjacent active quantum well region 201 by an electron barrier 202a.

In accordance with this feature (4) of the present invention, this first electron barrier 202a of hole injector region 202 can have a thickness sufficient to lower a square of a wavefunction overlap between a zone-center active electron quantum well and injector hole states to not more than 5%.

Feature (5)—Reduction in Thickness of the InAs/Al(in)Sb Electron Injector

As described above with respect to FIG. 1 and as seen in FIGS. 2A and 2B, electron injector 203 comprises a series of alternating barriers and quantum wells. The thickness of the wells is graded so as to compensate the applied field with quantum confinement, resulting in the formation of a miniband that allows rapid electron transport through the electron injector. In accordance with this feature (5) of the present invention, the total thickness of the InAs/AlSb electron injector 203 of the gain medium can be reduced considerably, from 400-500 Å in earlier designs to 200-250 Å.

As noted above, the thicknesses of the wells in electron injector 203 are graded, and so in some embodiments the reduction in total thickness can largely be achieved by substantially reducing the thickness of the first QW 203a. Thus, in an exemplary embodiment of a gain material having features in accordance with the present invention, the thickness of the first QW 203a is reduced, from 70-100 Å in earlier designs to 40-50 Å.

In addition, as described above, electron injector 203 comprises a number of alternating quantum wells and barriers. In accordance with the present invention, an electron injector can comprise from 4 to 9 InAs quantum wells separated by Al(In)Sb barriers each having a thickness of ≈12 Å, where the optimum number of wells is related to the desired emission wavelength. For shorter wavelengths, more wells are used since the voltage drop per stage is roughly proportional to the photon energy. On the other hand, fewer wells are employed for longer-wavelength ICLs. However, the wells near the next stage are much thinner for shorter-wavelength, structures, so that the total thickness of electron injector 203 does not vary as much.

Thus, an exemplary embodiment of an electron injector having features in accordance with the present invention for an emission wavelength of 4.3 μm at 300 K can have alternating barriers and wells comprising the following structure: 42 Å InAs/12 Å AlSb/33 Å InAs/12 Å AlSb/28 Å InAs/12 Å AlSb/25 Å InAs/12 Å AlSb/23 Å InAs/12 Å AlSb/23 Å InAs/25 Å AlSb.

In addition, in accordance with this feature of the present invention, the final AlSb barrier 203b between electron injector 203 and the next cascaded active QW region 201 can be much thicker than the others in the electron injector to prevent strong hybridization of the lasing electron subband in the active QW region 201 with the miniband of the injector 203.

The advantages of a thinner electron injector in accordance with this feature of the present invention are twofold. First, the thinner electron injector results in a reduction in the density of states of the electrons in the electron injector, which causes fewer holes to be injected into the hole injector and, subsequently, into the active QW region and thus reduces the internal loss due to free-hole absorption. Second, the average refractive index of the active gain region and the injectors increases because low-index InAs/Al(In)Sb layers now form a smaller fraction of the total active gain region and high-index Ga(InAlAs)Sb layers form a larger fraction, which results in better optical confinement.

When these advantages are taken together, Feature (5) results in a lower internal loss due to free hole absorption as well as a higher optical confinement factor.

Feature (6)—Small Number of Cascaded Stages

As described above, an interband cascade gain medium includes an active gain region comprising a number of cascaded stages, each cascaded stage having active QWs 201, a hole injector 202, and an electron injector 203.

Earlier ICLs fabricated at University of Houston, Army Research Laboratory, Maxion, and JPL always employed at least 12 and as many as 35 stages. Such a large number of stages was required in part because those lasers had higher internal losses than the recent NRL ICLs that employ the invention.

However, because of the reduction in internal optical losses associated with use of one or more of the features described herein, the number of such cascaded stages in the gain medium can be reduced. Thus, depending on the modal loss and the gain required, in accordance with feature (6) of the present invention, an interband cascade gain medium in accordance with the present invention can comprise between 2 and 7 cascaded stages, significantly fewer than the 12-35 stages used in prior ICLs. The optimal number of stages is chosen so that each stage provides from 3 to 8 $cm^{-1}$ of modal gain (material gain multiplied by the optical confinement factor) in order to produce enough gain to reach the threshold for lasing at room temperature, before thermal runaway prevents the occurrence of lasing.

Earlier NRL structures usually employed either 5 or 10 stages, although the older 5-stage devices performed poorly at higher temperatures because their losses were too high for the gain to be adequate. However, NRL testing has confirmed that when the internal loss is reduced, for example, through employment of a graded doping scheme such as that described below, the high-temperature performance in continuous-wave mode can be substantially improved when 5 stages are employed rather than 10. One recent NRL structure achieved favorable performance with only 3 stages.

Because a significant fraction of the loss comes from the active layers, reducing the number of stages can further reduce the loss and therefore improve the slope and wallplug efficiencies. In addition, reducing the number of stages in the gain material can also lower lasing thresholds, further contributing to the efficiency of a laser using such a material.

Feature (7)—Graded Transition Regions to Smooth Out Abrupt Shifts of the Conduction Band Minimum According to feature (7) of the present invention, specially-designed graded transition regions can be employed to smooth out band discontinuities between the various regions of the waveguide that have misaligned conduction band minima.

In the presence of a significant conduction band discontinuity, a large potential barrier forms at the interface between two regions and impedes the carrier transport. This can result in an extra voltage drop that requires additional heat dissipation and lowers the device's wallplug efficiency. However, if each discontinuity is smoothed out via the incorporation of a graded transition region with a conduction-band position that gradually varies between those of the two regions that are to be joined, the height and spatial extent of the potential barriers are greatly reduced, as is the parasitic voltage drop.

In an exemplary embodiment of an interband cascade gain medium having this feature, a series of graded InAs/AlSb and InAs/AlSb/GaSb transition superlattices, all of which are strain-compensated to the GaSb lattice constant, can be used to gradually grade the height of the conduction band minimum.

An exemplary embodiment can employ transitions between the active gain region and the SCLs. In such an embodiment, the transition layers can comprise 8 periods of 20.1 Å InAs/19 Å AlSb, 10 periods of 15.9 Å InAs/15 Å AlSb, and 12 periods of 7 Å InAs/6.4 Å AlSb/15 Å GaSb. The same graded transition layers can be used between the GaSb buffer layer or substrate and the bottom optical cladding layer, and between either of the optical cladding layers and the adjacent SCL.

In addition, in some embodiments, the following graded transition layers can be used between the top cladding region and the $n^+$-InAs cap layer, starting from the cladding: 7 periods of 29 Å InAs/14 Å AlSb, 6 periods of 42 Å InAs/12 Å AlSb, and 4 periods of 65 Å InAs/10 Å AlSb. These transition layers between the cladding and the cap can be used either with or without the transition layers between the active gain region and the SCLs.

In some embodiments, these graded transition regions are doped to a level of $0.5-5\times10^{17}$ $cm^{-3}$, with the higher doping level being employed in regions of low overlap with the lasing optical mode. A lower doping level may be employed in regions of high overlap with the lasing mode, although a higher level can be used there as well to further minimize voltage barriers and to reduce the susceptibility to damage at high injection currents.

Feature (8)—Thick High-Index Ga(AlInAs)Sb Separate Confinement Layer

Since the average refractive index of the active stages is not very high, they cannot by themselves confine a guided optical mode when a small number of active stages is employed.

Feature (8) can be employed in an interband cascade gain medium in accordance with the present invention to remedy this effect. In accordance with this feature of the present invention, a high-index Ga(AlInAs)Sb separate confinement layer (SCL) can be used to confine the optical mode and increase its overlap with the active stages. By making the SCLs thick, this feature can also substantially lower the modal loss. Since typically the Ga(AlInAs)Sb of the separate confinement layer (SCL) has much lower material loss than the superlattices of the active and cladding layers, the net modal loss is lower if a large fraction of the mode resides in the SCL.

In an exemplary embodiment of the use of this feature in an interband cascade gain medium according to the present invention, a 200-nm-thick Ga(AlInAs)Sb SCL is positioned both above and below the active gain region of the gain medium. In some embodiments, the SCLs can be doped n-type to a low level of $<2\times10^{17}$ $cm^{-3}$, although doping should be high enough to compensate for the usual p-type background doping of the SCL material. In some embodiments, GaSb can be used for the SCLs, although adding some AlAs to form $Al_xGa_{1-x}As_ySb_{1-y}$ (lattice-matched to GaSb) can also be used to lower the refractive index of the SCL and thereby increase the modal overlap with the active stages. In addition, AlGaInAsSb or AlGaSb layers with a slight lattice mismatch with respect to the GaSb substrate can also be used.

In some embodiments of the interband cascade gain medium having this feature, the SCL layers can be quite thick, e.g., 0.4-1 µm for a total thickness of 0.8-2 µm for both SCLs, in order to concentrate a substantial fraction of the optical mode in a region with very low optical losses. In any case, however, the SCLs must not be so thick that lasing occurs in a higher-order vertical mode rather than the fundamental mode, since such a mode would have wider beam divergence and be more susceptible to multi-mode lasing.

Feature (9)—Graded Doping Profile in the Cladding Layers

In accordance with this feature (9) that can be used in an interband cascade gain medium in accordance with the present invention, a graded doping profile can be used in one or more of the semiconductor material layers comprising the gain medium.

For example, in an exemplary embodiment of a gain medium having this feature, in the ≈1-1.5 µm portion of the bottom and top cladding layers that are adjacent to the active gain region (or SCL if such a separate layer according to Feature (8) is used), the doping level can be lowered, for example, to $0.5-2\times10^{17}$ cm$^{-3}$, whereas the remaining outer portions of the claddings retain a higher doping level, for example, $2-5\times10^{17}$ cm$^3$.

The thickness of the lower-doped portion of the cladding can depend on the emission wavelength, and thicker low-doped regions can be used at longer wavelengths. In a gain medium having this feature in accordance with the invention, the lower-doped region can be thick enough that no more than 0.5% of the lasing mode overlaps the higher-doped region of the cladding.

In addition, in some embodiments, the total thickness of the bottom cladding can also be increased, typically to >4 µm, in order to avoid any loss to the high-index substrate modes. The thickness of the top optical cladding layer is less critical, although it can be great enough to avoid excessive loss due to overlap of the optical mode with the contact metallization.

In some embodiments, the ratio of the field intensity in the lasing mode at the top of the bottom cladding to that at the bottom of the bottom cladding can be less than $10^{-5}$.

In addition, the higher-doped and lower-doped portions of the optical cladding layers can be separated by one or more boundary layers in which the doping level is gradually graded from lower to higher doping. The thickness of this layer can be about 100 nm.

Thus, an interband cascade gain medium can include any one or more of Features (1)-(9) described above to achieve the various advantageous aspects associated therewith. As described below, these advantages have been confirmed by the results of recent testing of interband cascade lasers that employ gain media incorporating one or more of the features comprising the present invention.

Figure 3:
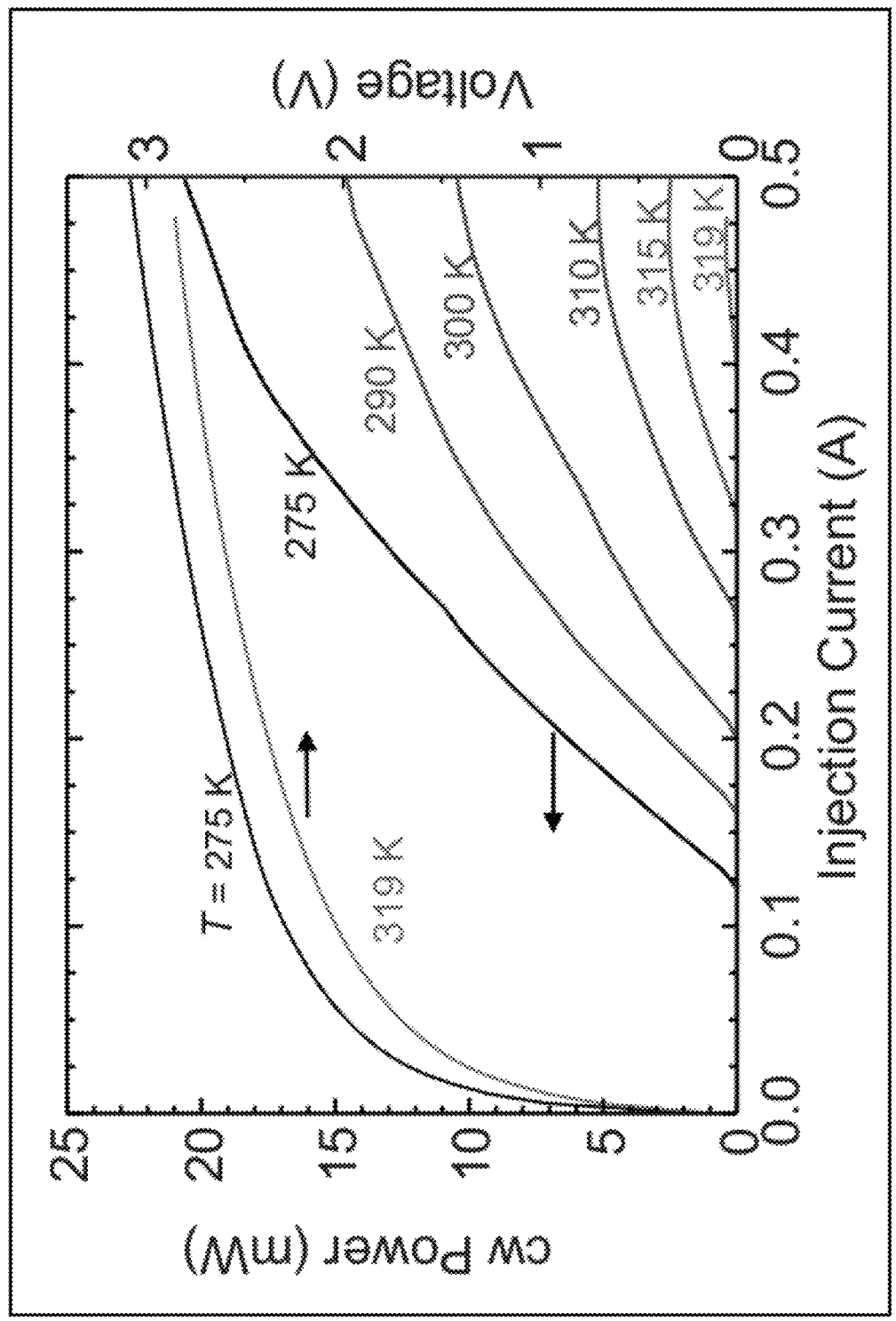
FIG. 3 depicts continuous wave light-current-voltage characteristics of an exemplary embodiment of a laser comprising an interband cascade gain medium in accordance with the present invention.

In one exemplary embodiment in accordance with the present invention, a 5-stage interband cascade laser (ICL) emitting at λ=3.75 µm recently operated in a continuous-wave (cw) mode up to a maximum temperature of $T_{max}$=319 K. This ICL incorporated all 8 features of the present invention, although the SCLs were much thinner than the thicknesses described above with respect to Feature (8), namely 0.2 µm rather than the 0.5-1 µm described therein. The ICL was patterned into a 9-µm-wide, 3 mm-long ridge with a high-reflectivity coating on one of the facets. Next, it was covered with a gold electroplating designed to improve the heat dissipation and mounted epitaxial side up. The device produced over 10 mW of cw power at room temperature. The cw threshold voltage at 300 K was 2.49 V, which implies a parasitic voltage drop of 0.81 V and a "voltage efficiency" of 67%. The cw light-current-voltage characteristics for this device for several operating temperatures near ambient are shown in FIG. 3. ICLs having two other ridge widths, 5 µm and 11 µm, also achieved room-temperature cw operation.

At cryogenic operating temperatures, lasing threshold current densities as low as 2 A/cm$^2$ were observed. A maximum cw wall-plug efficiency of 32.4% was estimated for a broad-area 0.5 mm-long ICL without any electroplating. A maximum cw output power of 1.8 W was observed for a broad-area 4 mm-long ICL.

Pulsed testing of other ICLs optimized according to some or all of the features of this invention disclosure has shown the potential for achieving comparable cw operating characteristics over a wide wavelength range of at least 2.9-4.2 µm. The lifetimes and Auger coefficients were extracted by correlating the measured pulsed threshold current densities and slope efficiencies of broad-area ICLs with calculations of optical gain vs. carrier density in the active gain region. The internal loss was estimated using the experimental slope efficiencies. The extracted Auger coefficient was found to be relatively independent of the exact split between the internal efficiency and internal loss.

Figure 4:
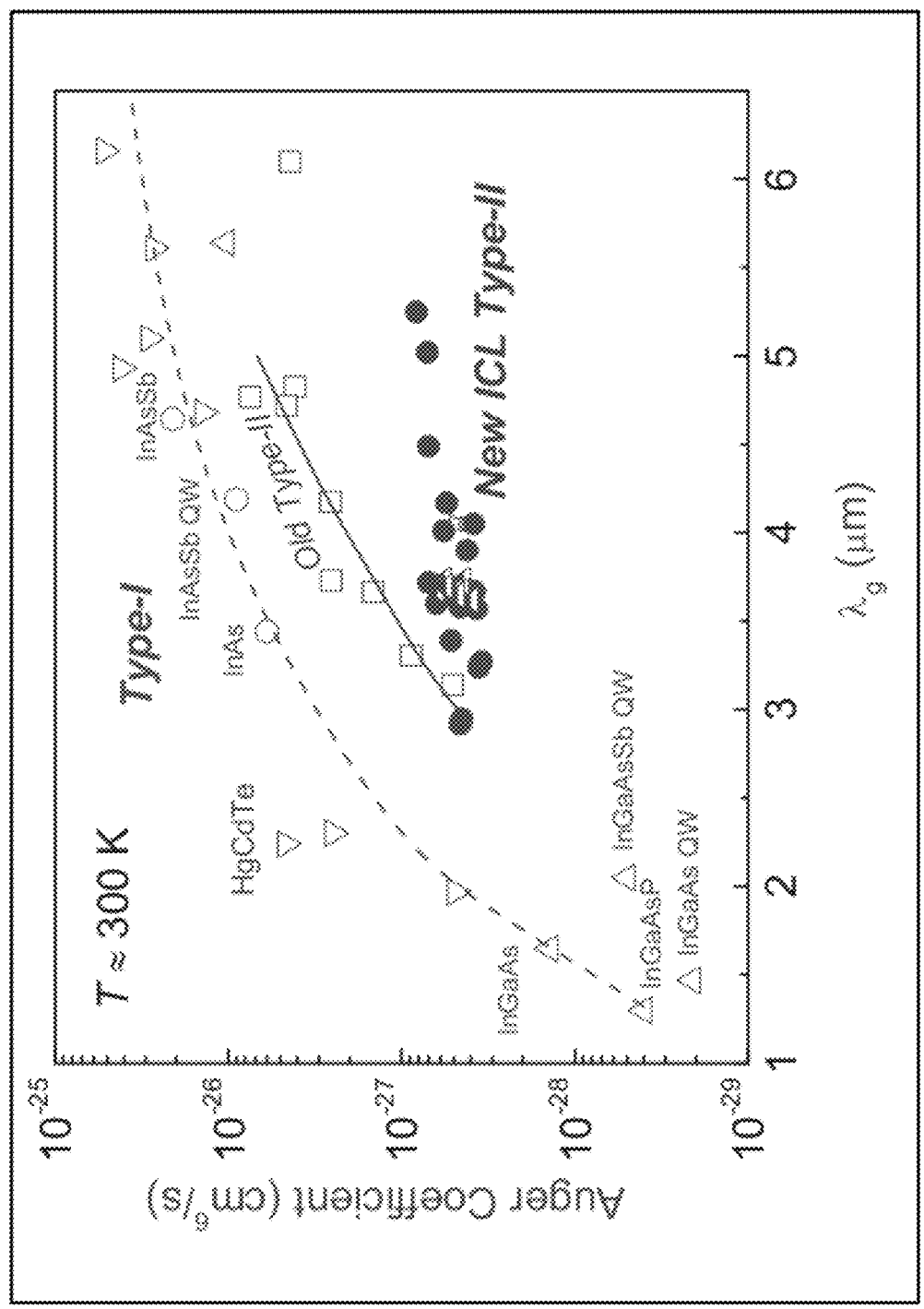
FIG. 4 is a plot of Auger coefficients vs. wavelength for various type-I and type-II semiconductor materials, including interband cascade gain media in accordance with the present invention.

The inventors found that all of the data points with 2.9 µm<λ<4.2 µm had Auger coefficients in the $4-6\times10^{-28}$ cm$^6$/s range. The results are shown in FIG. 4, along with the data for optically pumped type-II lasers and type-I semiconductor materials. The corresponding threshold current densities at 300 K also do not display much variation, and are as low as 415 A/cm$^2$ for an ICL emitting at λ=3.2 µm. The lowest internal loss of ≈6 cm$^{-1}$ (assuming an internal efficiency of 64% from a cavity-length study) is found for λ=3.6-4.2 µm. The loss increases by ≈50% as λ approaches 3 µm. An Auger coefficient of $7.1\times10^{-28}$ cm$^6$/s and a higher internal loss of 31 cm$^{-1}$ are observed for an ICL emitting at λ=5.0 µm.

Although particular embodiments, aspects, and features have been described and illustrated, it should be noted that the invention described herein is not limited to only those embodiments, aspects, and features.

For example, relatively small (<40%) fractions of In can be added to the GaSb hole wells and AlSb barriers, and small amounts of Sb (<30%) can be added to the InAs electron wells without altering the basic principles of the invention.

More than two hole wells can be used in the hole injector, and the thickness of each hole well can be increased beyond the value given in the described embodiments. Similarly, the composition and thickness of the barriers in the hole injector can be changed somewhat without critically affecting the device operation. The thickness and the In fraction of the GaInSb active hole well can be increased further, if growth conditions permit, or decreased slightly.

The doping in the claddings, SCLs, and transition regions can be changed somewhat while retaining a relatively low internal loss, and the amount of the overlap of the higher-doped region with the mode can be increased or decreased slightly.

The thicknesses and compositions of the layers in the transition regions can be changed, as long as the position of the conduction band minimum in the transition is still intermediate between those of the two functional regions of the device.

One, two, or more SCL regions can be employed. In almost any layer where GaSb, GaInSb, or AlSb is specified above, related binary, ternary, quaternary, or quinternary alloys based on the Ga(InAlAs)Sb system may usually be substituted, as long as the primary function of a "barrier", "hole quantum well", etc., continues to be satisfied. The same is true of InGaAlAsSb rather than InAs or Al(In)Sb.

The structure may also include a bottom contact layer, if both top and bottom contacts are to be made from the epitaxial side of the device. Or electrical contacts may be made without any distinct contact layer(s) being present.

Finally, as noted above, while NRL testing has confirmed that all 8 of the features described above are generally beneficial to the laser operation, it may often be possible to maintain attractive ICL performance by using any one or more of the 8 features, either alone or in combination with any other of the 8 features.

It should be readily appreciated that modifications may be made by persons skilled in the art, and the present application contemplates any and all modifications within the spirit and scope of the underlying invention described and claimed herein. All such combinations and embodiments are within the scope of the present disclosure.

What is claimed is:

1. An interband cascade gain medium, comprising:
   an active gain region, the active gain region having a first end and a second end opposite the first end and having a cladding layer at each of the first and second ends, the active gain region comprising a plurality of cascading stages, each of the cascading stages including:
   an active gain quantum well region;
   a hole injector region adjacent the active gain quantum well region; and
   an electron injector region adjacent the hole injector region;
   each of the active gain quantum well region, the hole injector region, and the electron injector region comprising a plurality of electron barriers and at least one of an electron quantum well and a hole quantum well, the active gain region having an active gain quantum well region of a first stage at the first end thereof and an electron injector region of a last stage at the second end thereof; and
   further comprising at least one high-refractive-index separate confinement layer comprising one of GaSb, GaInSb, GaAlSb, GaAsSb, GaAlAsSb, GaInAsSb, GaAlInSb, and GaAlInAsSb and having a total thickness of at least about 0.8 µm disposed at at least one of the first and second ends of the gain medium between the active gain region and a corresponding cladding layer.

2. The interband cascade gain medium according to claim 1, wherein a total thickness of at least one electron injector region of at least one stage of the active gain region is less than about 250 Å.

3. The interband cascade gain medium according to claim 2, wherein the hole injector region comprises two hole quantum wells, each of the two hole quantum wells comprising one of GaSb, GaInSb, GaAlSb, GaAsSb, GaAlAsSb, GaInAsSb, GaAlInSb, and GaAlInAsSb, a total thickness of the two hole quantum wells being greater than about 100 Å.

4. The interband cascade gain medium according to claim 2, wherein the active gain quantum well region is separated from the adjacent hole injector region by an electron barrier having a thickness sufficient to lower a square of a wavefunction overlap between a zone-center active electron quantum well and injector hole states to not more than 5%.

5. The interband cascade gain medium according to claim 1, wherein the hole injector region comprises two hole quantum wells, each of the two hole quantum wells comprising one of GaSb, GaInSb, GaAlSb, GaAsSb, GaAlAsSb, GaInAsSb, GaAlInSb, and GaAlInAsSb, a total thickness of the two hole quantum wells being greater than about 100 Å; and
   wherein at least one hole injector region of at least one stage of the active gain region is separated from an adjacent electron injector region by an electron barrier comprising one of AlSb and AlGaInAsSb and having a thickness at least about 20 Å.

6. The interband cascade gain medium according to claim 1, wherein the active gain quantum well region is separated from the adjacent hole injector region by an electron barrier having a thickness sufficient to lower a square of a wavefunction overlap between a zone-center active electron quantum well and injector hole states to not more than 5%; and
   wherein at least one hole injector region of at least one stage of the active gain region is separated from an adjacent electron injector region by an electron barrier comprising one of AlSb and AlGaInAsSb and having a thickness at least about 20 Å.

7. An interband cascade gain medium, comprising:
   an active gain region, the active gain region having a first end and a second end opposite the first end and comprising a plurality of cascading stages, each of the cascading stages including an active gain quantum well region, a hole injector region adjacent the active gain quantum well region, and an electron injector region adjacent the hole injector region, each of the active gain quantum well region, the hole injector region, and the electron injector region comprising a plurality of electron barriers and at least one of an electron quantum well and a hole quantum well, the active gain region having an active gain quantum well region of a first stage at the first end thereof and an electron injector region of a last stage at the second end thereof;
   wherein at least one hole injector region of at least one stage of the active gain region is separated from an adjacent electron injector region by an electron barrier comprising one of AlSb and AlGaInAsSb and having a thickness at least about 20 Å; and
   wherein a total thickness of at least one electron injector region of at least one stage of the active gain region is less than about 250 Å; and
   wherein the hole injector region comprises two hole quantum wells, each of the two hole quantum wells comprising one of GaSb, GaInSb, GaAlSb, GaAsSb, GaAlAsSb, GaInAsSb, GaAlInSb, and GaAlInAsSb, a total thickness of the two hole quantum wells being greater than about 100 Å.

8. An interband cascade gain medium, comprising:
   an active gain region, the active gain region having a first end and a second end opposite the first end and comprising a plurality of cascading stages, each of the cascading stages including an active gain quantum well region, a hole injector region adjacent the active gain quantum well region, and an electron injector region adjacent the hole injector region, each of the active gain quantum well region, the hole injector region, and the electron injector region comprising a plurality of electron barriers and at least one of an electron quantum well and a hole quantum well, the active gain region having an active gain quantum well region of a first stage at the first end thereof and an electron injector region of a last stage at the second end thereof;
   wherein at least one hole injector region of at least one stage of the active gain region is separated from an adjacent electron injector region by an electron barrier comprising one of AlSb and AlGaInAsSb and having a thickness at least about 20 Å; and wherein a total thickness of at least one electron injector region of at least one stage of the active gain region is less than about 250 Å; and wherein the active gain quantum well region is separated from the adjacent hole injector region by an electron barrier having a thickness sufficient to lower a square of a wavefunction overlap between a zone-center active electron quantum well and injector hole states to not more than 5%.

* * * * *